United States Patent [19]

Asano

[11] 3,821,167

[45] June 28, 1974

[54] PHOTO-SENSITIVE POLYMERS, PROCESS FOR PRODUCING SAME AND COMPOSITIONS CONTAINING SAID POLYMERS

[75] Inventor: Takateru Asano, Tokyo, Japan

[73] Assignee: Fuji Chemicals Industrial Co., Ltd., Tokyo, Japan

[22] Filed: May 10, 1971

[21] Appl. No.: 141,949

[30] Foreign Application Priority Data

May 15, 1970 Japan .............................. 45-41159

[52] U.S. Cl. ............... 260/49, 96/115 R, 96/115 P, 260/33.2 R, 260/334 R, 260/47 C, 260/47 CP

[51] Int. Cl. .......................................... C08g 17/14

[58] Field of Search ... 260/47 CZ, 47 CP, 49, 47 C; 96/115 R, 115 P

[56] References Cited

UNITED STATES PATENTS

| | | | |
|---|---|---|---|
| 3,096,311 | 7/1963 | Merrill et al. | 260/78.5 |
| 3,102,811 | 9/1963 | Barney | 96/48 |
| 3,446,651 | 5/1969 | Clachan et al. | 117/73 |
| 3,449,294 | 6/1969 | Danhauser et al. | 260/47 |
| 3,615,476 | 10/1971 | Cassiers et al. | 260/49 |

*Primary Examiner*—Lester L. Lee
*Attorney, Agent, or Firm*—Brisebois & Kruger

[57] ABSTRACT

The present invention relates to photo-sensitive polymers and compositions thereof which become insoluble on exposure to light and can be developed with an aqueous alkaline solution. These photo-sensitive polymers are obtained by reacting polyvinylalcohol with (1) aromatic aldehydes, carboxylic acids or sulfonic acids having light-sensitive groups, and (2) aromatic aldehydes, carboxylic acids or sulfonic acids having phenolic hydroxyl groups. These photo-sensitive compositions according to this invention have a large range of applications such as photomechanical processes and photofabrications, etc.

13 Claims, No Drawings

PHOTO-SENSITIVE POLYMERS, PROCESS FOR PRODUCING SAME AND COMPOSITIONS CONTAINING SAID POLYMERS

SUMMARY OF THE INVENTION

The present invention relates to photo-sensitive film-forming organic polymers and compositions thereof which become insoluble on exposure to light and can be developed with an aqueous alkaline solution, and more particularly to conventional photo-sensitive film-forming organic polymers containing conventional light-sensitive and phenolic hydroxyl group side chain that are soluble in an aqueous alkaline solution.

Conventional photo-sensitive organic polymer compositions which are insolubilized on exposure to light used for photomechanical processes and photoetching consist of polyvinylcinnamate and a known sensitizer or arylazide compound such as diazide chalcone and cyclized rubber. Coatings of such compositions become selectively insolubilized in the exposed areas while the unexposed areas remain soluble and are readily removable by a suitable solvent. Such development with organic solvents has, however, certain drawbacks. For instance, the fact that they are toxic, inflammable, expensive and difficult to handle makes it necessary to take special precautions in the process. Where the coating of such compositions is applied as a light-sensitive layer for a presensitized plate for offset printing, the unexposed coating, which is not always removed thoroughly with solvent may cause scum during printing.

Thus, since the advantage of applying alkali-soluble light-sensitive compositions has been realized, photo-sensitive compositions consisting of an alkali-soluble resin and a sensitizer, and polymers with a hydrophilic group as well as a light-sensitive group incorporated into their polymeric chain have been studied. For example, one such composition is described in German Patent No. 960,335 as a mixture of a paraquinonediazide compound and an alkali soluble phenol-formaldehyde condensation product. The coating formed by the alkali-soluble phenol-formaldehyde condensation product is weak to abrasions and scratches, and has a narrow latitude of dissolution of the non-exposed areas during the development. U.S. Pat. No. 2,861,058 describes a light-sensitive polymer obtained by esterifying polyvinylalcohol with cinnamic acid and succinic acid. The aqueous solution of ammonium hydroxide used for the developer has, however, many drawbacks; e.g., a very pungent odor, irritation to eyes and mucous membranes, and a narrow development latitude due to its volatility which decreases the concentration of ammonium hydroxide within the solution. Moreover, when this polymer was applied to a lithographic printing plate, the image areas of the said plate were not found to be satisfactorily ink receptive according to my experiment. It is also stated in U.S. Pat. No. 3,069,311 that a soluble light-sensitive polymer is produced by esterifying partially hydrolized polyvinylalcohol with azidophthalic acid anhydride. However, this polymer has some drawbacks. Firstly, many reaction steps are required for the production of this polymer, and secondly, when using this polymer as a coating for a printing plate, the latitude of the development of the plate is narrower than in the case of conventional coatings. The coating consisting of the polymer having more azidophthalic acid units is easily washed at the time of the development, while the coating consisting of this polymer contained less azidophthalic acid units is not easily developed.

In accordance with my invention, I prepared new photo-sensitive polymers containing recurring units having the following general structures:

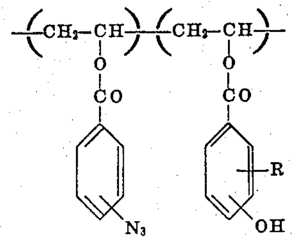
(I)

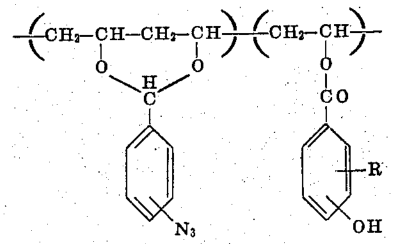
(II)

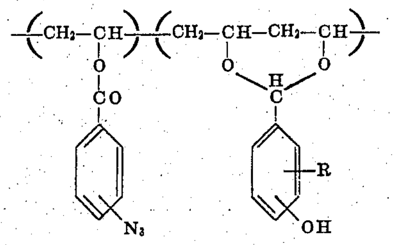
(III)

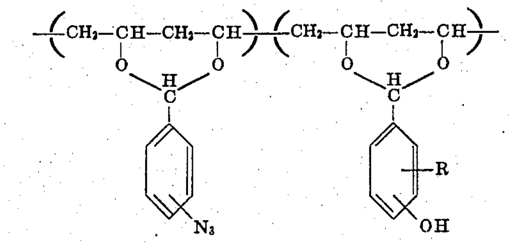
(IV)

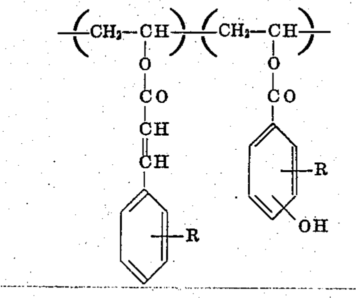
(V)

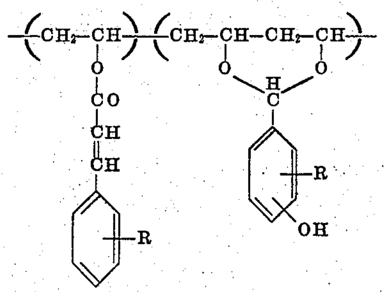
(VI)

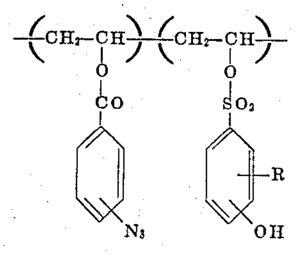
(VII)

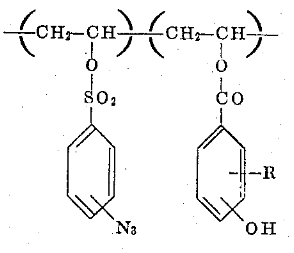
(VIII)

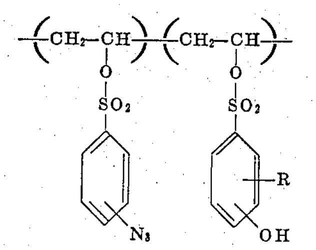
(IX)

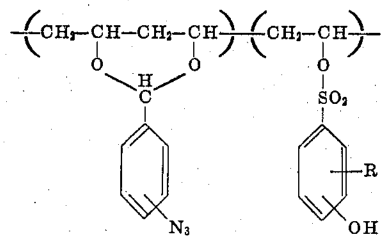
(X)

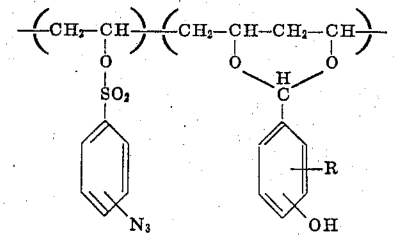
(XI)

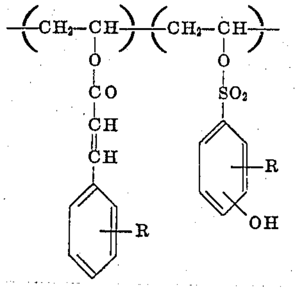
(XII)

wherein R is selected from the group consisting of hydrogen, alkoxyl, nitro and amino.

These photo-sensitive polymers are obtained by one of the following reactions:

1. esterifying polyvinylalcohol with an aromatic carboxylic acid or sulfonic acid having a light-sensitive group, and esterifying the reacted product with an aromatic carboxylic acid or sulfonic acid having a phenolic hydroxyl group, in either order;
2. acetalizing polyvinylalcohol with an aromatic aldehyde having a light-sensitive group, and esterifying the reacted product with an aromatic carboxylic acid or sulfonic acid having a phenolic hydroxyl group, in either order;
3. esterifying polyvinylalcohol with an aromatic carboxylic acid or sulfonic acid having a light-sensitive group, and acetalizing the reaction product with an aromatic aldehyde having a phenolic hydroxyl group, in either order; and
4. acetalizing polyvinylalcohol with an aromatic aldehyde having a light-sensitive group, and acetalizing the reaction product with an aromatic aldehyde having a phenolic hydroxyl group, in either order, wherein aromatic aldehydes are selected from the group consisting of p-azidobenzaldehyde, p-hydroxy benzaldehyde, vanillin and salicylaldehyde, carboxylic acids are selected from the group consisting of p-azidobenzoic acid, cinnamic acid, nitro cinnamic acid, salicylic acid and p-aminosalicylic acid, and sulfonic acids are selected from the group consisting of p-azidobenzensulfonic acid and p-hydroxybenzen sulfonic acid; the polyvinylalcohol used as a starting material has $\bar{P}_w$ (weight average degree of polymerization) of 300–2000, viscosity of 3–65 cps/25°C and 30–0% of acetyl group.

Acetalization may be carried out in a suitable solvent such as glacial acetic acid or dioxane, at a temperature of 50°–60°C for about 5 hours. Esterification may be carried out in a suitable organic base solvent such as pyridine, picoline or dimethylformamide, at a temperature of 50°–60°C for 3–4 hours.

These photo-sensitive polymers consist essentially of two groups which are (1) ethylene units containing arylazide or cinnamic acid light-sensitive group side chains and ethylene units containing phenolic hydroxyl group side chains which give the polymer alkali solubility when the amount of the ethylene-phenolic hydroxyl group is not less than 30 mol percent of recurring ethylene units.

The light sensitive polymers of this invention have specific IR absorption spectra of 2100 $cm^{-1}$ characteristic of the aromatic azide group or of 1610 $cm^{-1}$ characteristic of the double bond of the cinnamic acid group, and of 3400–3500 $cm^{-1}$ characteristic of the phenolic hydroxyl group.

When the inherent sensitivity of these photo-sensitive polymers is not satisfactory, the conventional spectral sensitizers can be employed at 10 percent by weight with the above photo-sensitive polymers to increase their light-sensitivity. These sensitizers include hydrocarbons such as acenaphthene, fluorene and pyrene, nitro compounds such as 5-nitroacenaphthene, 2-nitrofluorene, 1-nitropyrene, p-nitrobenzaldehyde and p-nitroaniline, quinones such as p-benzoquinone, α-naphthoquinone, 1,2-benzanthraquinone and chlor-1,2-benzanthraquinone, ketones such as Michler's ketone, 9-fluorenone and 1,8-phthaloylnaphtalene, and other compounds such as acridine and diphenyl disulfide, etc. The photo-sensitive polymer and spectral sensitizer are dissolved in a suitable solvent, for example, ethyleneglycol monoalkylether, to prepare the photo-sensitive composition to be used. The light-senstiive compositions of this invention preferably consist of 5–30 parts of photo-sensitive polymer, about one tenth parts of spectral sensitizer, and 100 parts of solvent by weight respectively.

The photo-sensitive composition relating to the present invention can be applied to various supports for use as printing plates, such as aluminum, zinc, magnesium and various alloys thereof. Presensitized plates which can be stored for a long period of time before the processing are also produced the same way. This composition is suitable for forming a photo-sensitive film on a plastic support such as polyethylene terephthalate film, which is used for the production of printed circuit boards, etc.

In order to avoid chemical reaction with the surfaces of metal supports, a developer suitable for these photo-sensitive compositions is a weakly alkaline aqueous solution, preferably 1–10 percent, for example, of sodium hydroxide, an aqueous solution of sodium metasilicate or sodium triphosphate, etc. Since these alkali solutions can be developed by dissolving the unexposed areas, they may be employed for tray, tank and spray developments which do not require any physical treatments, such as rubbing, swabbing, etc. A surfactant may be employed with the developer to increase the penetration thereof into the unexposed coating areas.

An advantage of this invention is that photo-crosslinked image areas of the coating are readily dissolved and removed with conventional concentrated alkaline solutions or suitable organic solvents such as alcohols and/or alcohol ethers, since phenolic hydroxyl groups not pertaining to photo-crosslinking still remain in those image areas.

The following examples illustrate the present invention:

EXAMPLE 1

[Synthesis method of the polymers having the structure (IV)]

To a dispersion of 22 g of polyvinylalcohol ($P_u$=800) in 300 ml of glacial acetic acid, 11 g of p-azidobenzaldehyde, 21.4 g of p-hydroxy benzaldehyde and 20 ml of 30% sulfuric acid aqueous solution were added successively while stirring the mixture. The mixture was then heated while stirring for 3 hours at 50°–60°C for acetalization. The reaction mixture was cooled and dropped into water to educe the resin, which was washed with water and dried. The Infrared absorption spectrum of the obtained compound was

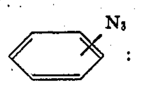

2100 $cm^{-1}$ and

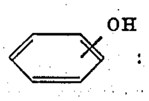

3500–3400 $cm^{-1}$.

A light-sensitive composition containing 5 g of the photo-sensitive polymer obtained by the above method, 0.5 g of 1,2-benzanthraquinone as a sensitizer, and 100 g of ethyleneglycol monoethylether, was coated onto a sheet of aluminum plate grained to form a thin layer thereon. After drying, this layer was exposed to light through a negative transparency by using a 100 V, 50 Amp. carbon arc lamp for 3 minutes and then was developed with a 5% aqueous solution of trisodiumphosphate containing 1% of sodium alkyl naphtalene sulfonate to remove the coating of the unexposed areas, washed with water again, and finally inked up.

In actual runs, with this printing plate placed on a "Mitsubishi-Marinoni" web offset press, more than 200,000 prints have been made without any scumming of the plate and with the prints exhibiting outstanding clarity and detail.

Moreover, the coating layer according to this invention could be stored in a light-proof container more than six months without any change in its quality.

EXAMPLE 2

[Synthesis method of the polymers having the structure (V)]

11 g of polyvinylalcohol ($P_u$=2000) and 100 ml of pyridine were stirred together at a temperature of 100°C for 24 hours. After cooling to 50°C, 13 g of cinnamoyl chloride, 25 g of salicyloyl chloride and 100 ml of pyridine were added to this solution. The mixture was further stirred to 50°C for 4 hours for esterification. The reaction mixture was diluted with 1000 ml of acetone and was filtered. The filtrate was poured into a great deal of vigorously agitated water to isolate the resin which was washed with water and dried. The Infrared absorption spectrum of the obtained compound was CH=CH of cinnamic acid: 1610 $cm^{-1}$ and

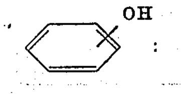

3500–3400 $cm^{-1}$.

The light-sensitive composition containing 5 g of photo-sensitive polymer obtained by the above method, 0.5 g of 5-nitroacenaphtene, -nitroacenaphthene, 100 g of ethyleneglycol monoethylether were coated onto a sheet of steel-copper-chrome trimetallic plate to form a thin coating layer thereon. After drying, this layer was exposed to light through a positive transparency with a xenon lamp for 5 minutes and was developed with a 5% aqueous solution of sodium hydroxide to remove the coating from the unexposed areas, and washed with water. The chromium surface of the plate was treated with an etching solution for the trimetal plate consisting of a saturated solution of calcium chloride and hydrochloric acid to expose the copper, and then washed with water. The exposed coating layer was removed with a 20% aqueous solution of sodium hydroxide, and the copper image areas were then activated and inked up.

EXAMPLE 3

[Synthesis method of the polymers having the structure (III)]

34 g of vanilling and 25 ml of a 20% sulfuric acid solution were added to a dispersion of 22 g of polyvinylalcohol ($P_u$=500) in 300 ml of glacial acetic acid, while stirring. The mixture was stirred for 3 hours at 50°C for acetalization. After reaction, the mixture was cooled and poured into water to educe the resin, which was washed with water and dried. 10.2 g of the reaction product and 5.5 g of p-azidobenzoyl chloride were then added to 200 ml of pyridine and the mixture was stirred for 5 hours for esterification. The reaction mixture was diluted with acetone and dropped into water to educe the resin, which was washed with water and dried. The Infrared absorption spectrum of the obtained compound was

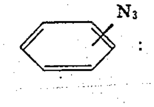 :

2100 cm$^{-1}$.

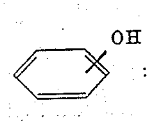 :

3500–3400 cm$^{-1}$ and

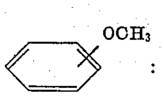 :

2850 cm$^{-1}$.

A photo-sensitive composition consisting of 10 g of photo-sensitive polymer obtained by the above method, 0.1 g of 2-nitrofluorene as a sensitizer, and 0.05 g of crystal violet in 100 g of ethyleneglycol monomethylether, was coated onto a sheet of polyethylene terephthalate film and dried. This sensitized dry film was laminated to the copper surface of a printed circuit board with heated pressure rolls, and exposed to light through a negative transparency by means of an ultra high pressure mercury lamp for 2 minutes. After peeling off the support film, the exposed layer was developed with a 5% sodium metasilicate aqueous solution containing 1% of sodium alkylbenzene sulfonate as a developer, and then washed with water and dried. The exposed copper surface was etched with a ferric chloride solution and the image layer was removed with methanol.

The light-sensitive layer coated onto polyethylene terephthalate film according to the present invention can be stored in a light-proof package more than six months without any change in its quality.

EXAMPLE 4

[Synthesis method of the polymers having the structure (I)]

A light-sensitive composition containing a photosensitive polymer which was produced as in the foregoing Example 2 by using 14 g of p-azidobenzoic chloride instead of 13 g of cinnamoyl chloride, was prepared. (The Infrared absorption spectrum of the obtained compound was

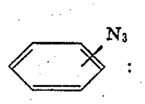 :

2100 cm$^{-1}$ and

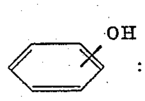 :

3500–3400 cm$^{-1}$.)

This composition was coated onto a zinc plate to form a thin layer thereon. After drying, this layer was exposed to light through a negative transparency by using a 100 V, 50 Amp. carbon arc lamp for 3 minutes, and then was developed with 5% aqueous solution of sodium hydroxide to remove the coating of unexposed areas. The developed was etched with a conventional etching composition containing nitric acid and an additive to produce a zinc relief printing plate.

EXAMPLE 5

[Synthesis method of the polymers having the structure (II)]

A light-sensitive composition containing 10 g of a photo-sensitive polymer was produced as in Example 3, by using 11 g of p-azidobenzaldehyde in place of 34 g of vanillin, and 11 g of the reaction product and 8.6 g of salicyloyl chloride in place of 5.5 g of p-azidobenzoyl chloride, and 0.1 g of 2-nitrofluorene in 100 g of ethyleneglycol monomethylether, was prepared. (The Infrared absorption spectrum of the obtained compound was

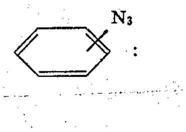 :

2100 cm$^{-1}$ and

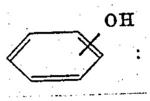 :

3500–3400 cm$^{-1}$.)

This composition was coated onto a cleaned piece of copper-clad, epoxy-fiber glassboard and dried. This coated piece was exposed to light through a negative transparency by means of an ultra high pressure mercury lamp for 2 minutes and then was developed with a 5% trisodiumphosphate aqueous solution containing 1% of sodium alkylbenzenesulfonate to remove the coating of the unexposed areas, washed with water and dried. The exposed copper surface was etched with a ferric chloride solution and the image layer was removed with methanol to give a high quality circuit board.

EXAMPLE 6

[Synthesis method of the polymers having the structure (VI)]

A photo-sensitive polymer was produced as in Example 3 by using 5 g of cinnamoyl chloride in place of 5.5 g of p-azidobenzoyl chloride. The Infrared absorption spectrum of the obtained compound was CH=CH of cinnamic acid: 1610 cm$^{-1}$,

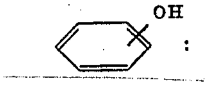 :

3500–3400 cm$^{-1}$ and

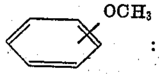 :

2850 cm$^{-1}$.

With the photo-sensitive composition containing this polymer, a presensitized plate for offset printing was prepared in accordance with the method described in the Example 1.

EXAMPLE 7

[Synthesis method of the polymers having the structure (VI)]

A light-sensitive polymer was produced as in Example 3 by acetalizing 22 g of polyvinylalcohol with 27 g of p-hydroxybenzaldehyde instead of 34 g of vanillin, and then esterifying 9.6 g of the reaction product with 6.4 g of m-nitrocinnamoyl chloride instead of 5.5 g of p-azidobenzoyl chloride. The Infrared absorption spectrum of the obtained compound was CH=CH of cinnamic acid: 1610 $cm^{-1}$,

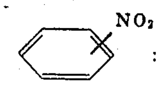

1560 $cm^{-1}$ and 1350 $cm^{-1}$, and

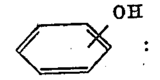

3500–3400 $cm^{-1}$.

With the light-sensitive composition containing the above polymer, the presensitized printing plate for offset printing was prepared in accordance with the method described in Example 1.

EXAMPLE 8

[Synthesis method of the polymers having the structure (I)]

A photo-sensitive polymer was produced as in Example 2 by using 13.7 g of p-azidobenzoyl chloride instead of 13 g of cinnamoyl chloride and 30 g of p-aminosalicyloyl chloride instead of 25 g of salicyloyl chloride. The Infrared absorption spectrum of the obtained compound was

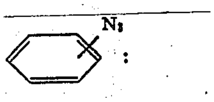

2100 $cm^{-1}$,

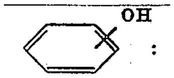

3500–3400 $cm^{-1}$ and

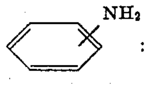

3500–3300 $cm^{-1}$.

With the light-sensitive composition containing above polymer, the printed circuit board was prepared in accordance with the method described in the foregoing Example 3.

EXAMPLE 9

[Synthesis method of the polymers having the structure (XII)]

A presensitized aluminum offset printing plate was prepared with a light-sensitive composition containing a photo-sensitive polymer which was produced as in Example 2 by using 33.4 g of p-hydroxybenzene sulfochloride instead of 25 g of salicyloyl chloride. (The Infrared absorption spectrum of the obtained compound was CH=CH of cinnamic acid: 1610 $cm^{-1}$,

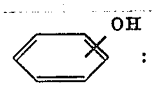

3500–3400 $cm^{-1}$ and $OSO_2$: 1420–1330 $cm^{-1}$ and 1200–1145 $cm^{-1}$.)

EXAMPLE 10

[Synthesis method of the polymers having the structure (VIII)]

A printed circuit board was prepared with a light-sensitive composition containing a photo-sensitive polymer which was produced as in Example 2 by using 17 g of p-azidobenzene sulfochloride instead of 13 of cinnamoyl chloride. (The Infrared absorption spectrum of the obtained compound was

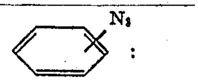

2100 $cm^{-1}$, $OSO_2$: 1420–1330 $cm^{-1}$ and 1200–1145 $cm^{-1}$ and

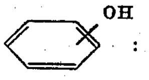

3500–3400 $cm^{-1}$.)

EXAMPLE 11

[Synthesis method of the polymers having the structure (IX)]

A presensitized bimetal plate for offset printing was prepared with a light-sensitive composition containing a photo-sensitive polymer which was produced as in Example 2 by using 17 g of p-azidobenzene sulfochloride instead of 13 g of cinnamoyl chloride and 33.4 g of p-hydroxybenzene sulfochloride instead of 25 g of salicyloyl chloride. (The Infrared absorption spectrum of the obtained compound was

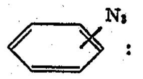

2100 $cm^{-1}$,

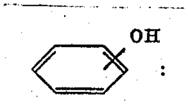

3500–3400 $cm^{-1}$ and $OSO_2$: 1420–1330 $cm^{-1}$ and 1200–1145 $cm^{-1}$.)

EXAMPLE 12

[Synthesis method of the polymers having the structure (X)]

A presensitized aluminum plate for offset printing was prepared with a light-sensitive composition containing a photo-sensitive polymer which was produced as in Example 3 by using 11 g of p-azidobenzaldehyde in place of 34 g of vanillin and, 11 g of the reaction product and 5.8 g of p-hydroxybenzene sulfochloride in place of 5.5 g of p-azidobenzoylchloride. (The Infrared absorption spectrum of the obtained compound was

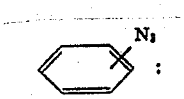

2100 $cm^{-1}$,

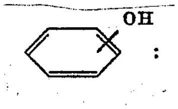

3500–3400 $cm^{-1}$ and $OSO_2$: 1420–1330 $cm^{-1}$ and 1200–1145 $cm^{-1}$.)

The photo-sensitive polymer represented by formula VII can be produced as in the foregoing Example 2 by using p-azidobenzoyl chloride instead of cinnamoyl chloride and p-bydroxybenzene sulfochloride in stead of salicyloyl chloride, and the photo-sensitive polymer represented by formula XI can be produced as in the foregoing Example III by using p-azidobenzene sulfochloride in stead of p-azidobenzoyl chloride.

What is claimed is:

1. The photo-sensitive film-forming organic polymers containing light-sensitive groups and phenolic hydroxyl groups which are soluble in an aqueous alkaline solution but rendered insoluble by exposure to light, and which consist essentially of recurring units selected from the group consisting of:

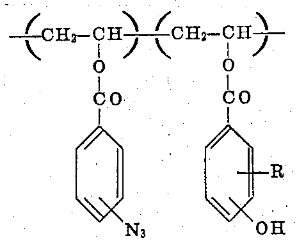
(I)

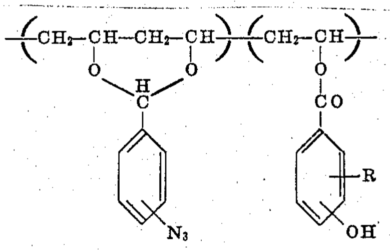
(II)

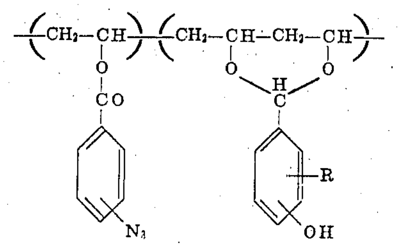
(III)

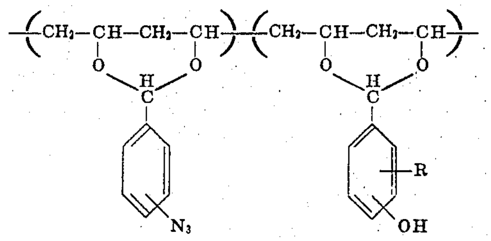
(IV)

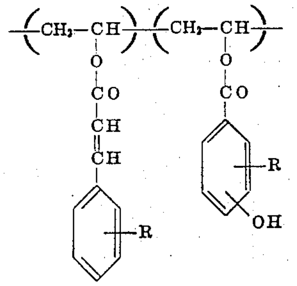
(V)

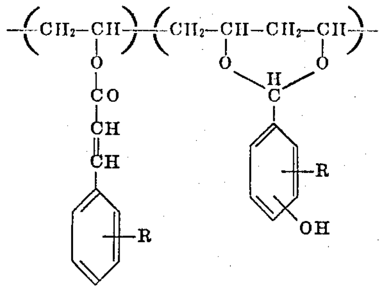
(VI)

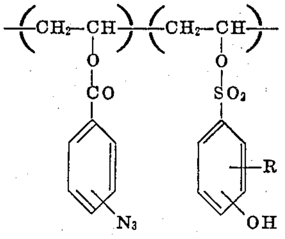
(VII)

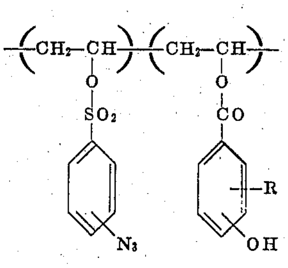
(VIII)

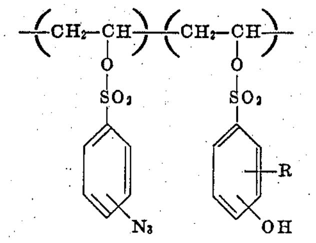
(IX)

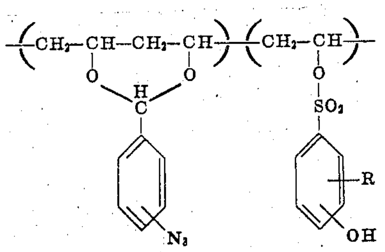
(X)

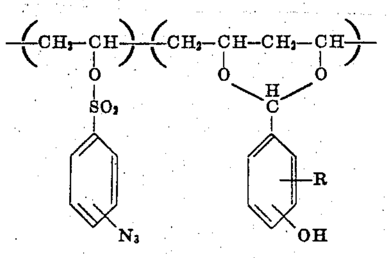
(XI)

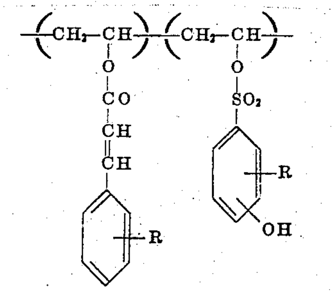
(XII)

in which R is selected from the group consisting of hydrogen, alkoxyl, nitro and amino.

2. The photo-sensitive film-forming organic polymers consisting of light-sensitive groups and phenolic hydroxyl groups which are soluble in aqueous alkaline solution but rendered insoluble on exposure to light, and consist essentially of the recurring units having the formula:

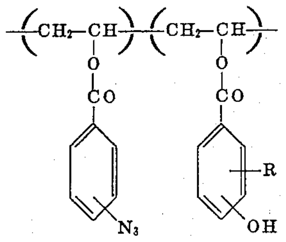

in which R is selected from the group consisting of hydrogen, alkoxyl, nitro and amine.

3. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

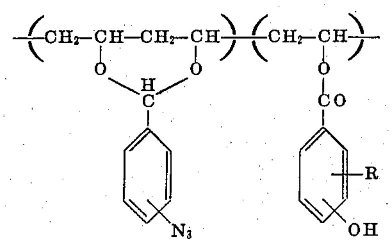

4. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

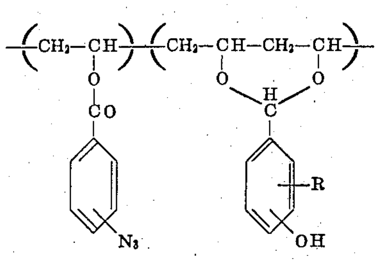

5. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

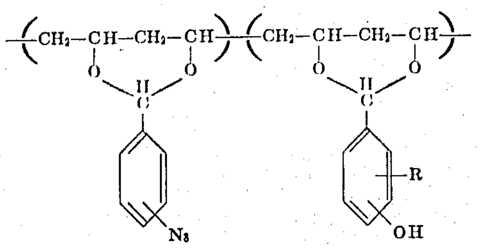

6. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

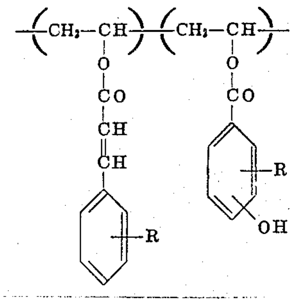

7. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

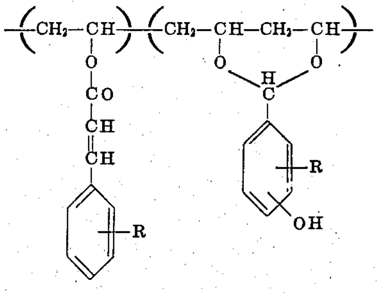

8. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

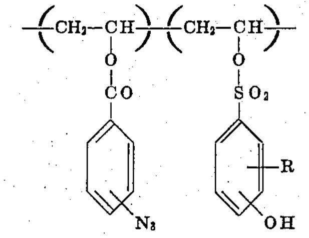

9. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

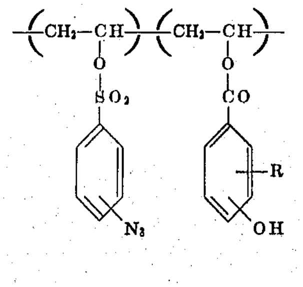

10. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

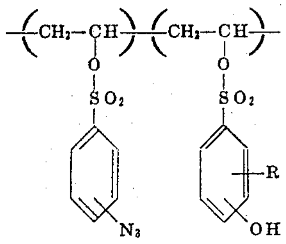

11. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

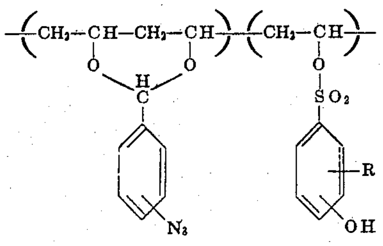

12. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

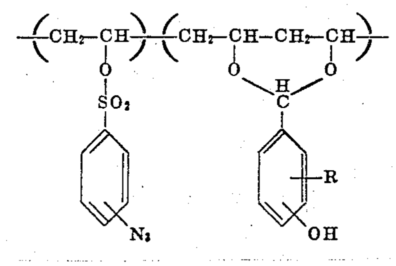

13. The photo-sensitive film-forming organic polymers of claim 1, containing light-sensitive groups and phenolic hydroxyl groups which are soluble in aqueous alkaline solution but rendered insoluble on exposure to light, and which consist essentially of the recurring units having the formula:

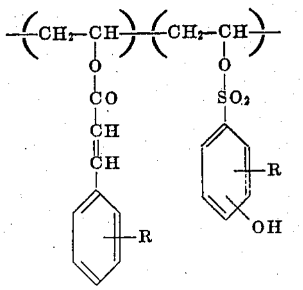

* * * * *